(12) United States Patent
Baba et al.

(10) Patent No.: US 11,126,049 B2
(45) Date of Patent: Sep. 21, 2021

(54) DISPLAY APPARATUS

(71) Applicant: Mitsubishi Electric Corporation, Tokyo (JP)

(72) Inventors: Tatsuya Baba, Tokyo (JP); Takafumi Hashiguchi, Tokyo (JP); Naruhito Hoka, Tokyo (JP); Naoya Hirata, Tokyo (JP)

(73) Assignee: Trivale Technologies LLC, Santa Clara, CA (US)

( * ) Notice: Subject to any disclaimer, the term of this patent is extended or adjusted under 35 U.S.C. 154(b) by 0 days.

(21) Appl. No.: 16/695,456

(22) Filed: Nov. 26, 2019

(65) Prior Publication Data

US 2020/0174329 A1 Jun. 4, 2020

(30) Foreign Application Priority Data

Dec. 4, 2018 (JP) .............................. JP2018-227100

(51) Int. Cl.
*G02F 1/1362* (2006.01)

(52) U.S. Cl.
CPC .... *G02F 1/136286* (2013.01); *G02F 1/13629* (2021.01); *G02F 2201/121* (2013.01); *G02F 2201/123* (2013.01)

(58) Field of Classification Search
CPC ..... G02F 1/136286; G02F 2001/13629; G02F 2001/13456; G02F 1/136204; G09G 2330/045; H01L 27/0248
See application file for complete search history.

(56) References Cited

U.S. PATENT DOCUMENTS

| 9,389,476 | B2 | 7/2016 | Park et al. |
| 9,837,443 | B2 | 12/2017 | Kawamura et al. |
| 2012/0092308 | A1* | 4/2012 | Chiang ................. G02F 1/1345 345/204 |
| 2014/0168552 | A1 | 6/2014 | Jo et al. |
| 2017/0294172 | A1* | 10/2017 | Yang ................... H01L 23/5226 |

FOREIGN PATENT DOCUMENTS

| JP | 2014119746 A | 6/2014 | |
| JP | 2016071082 A | 5/2016 | |
| WO | WO-2017072943 A1 * | 5/2017 | ............... G09F 9/30 |

* cited by examiner

*Primary Examiner* — Jessica M Merlin
(74) *Attorney, Agent, or Firm* — Studebaker & Brackett PC

(57) ABSTRACT

The display apparatus includes a plurality of gate lines, a plurality of vertical gate lines orthogonal to the gate lines, and a plurality of connection parts, each of which connects one of the gate lines and corresponding one of the vertical gate lines. The plurality of vertical gate lines extend from a first side in the display region. At least the gate line disposed closest to the first side is connected to the corresponding vertical gate line by a plurality of connection parts disposed at two or more locations.

6 Claims, 14 Drawing Sheets

F I G. 1 1
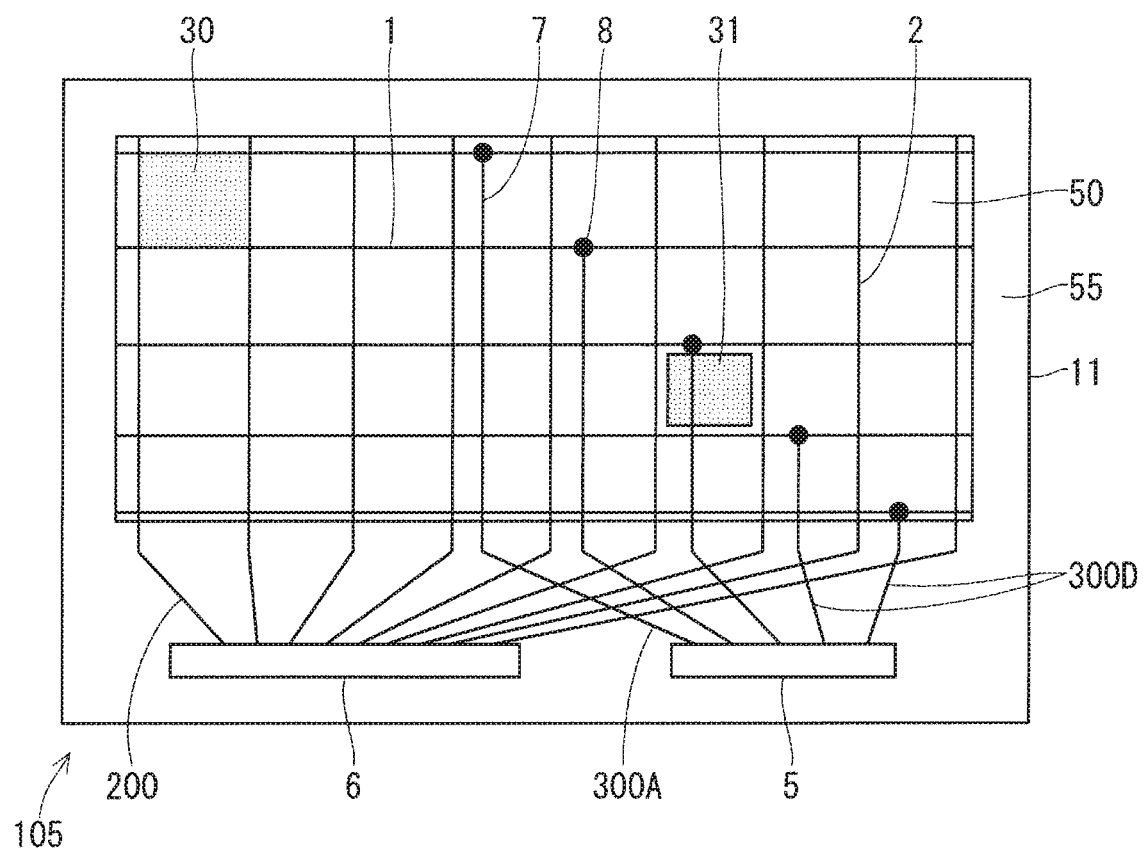

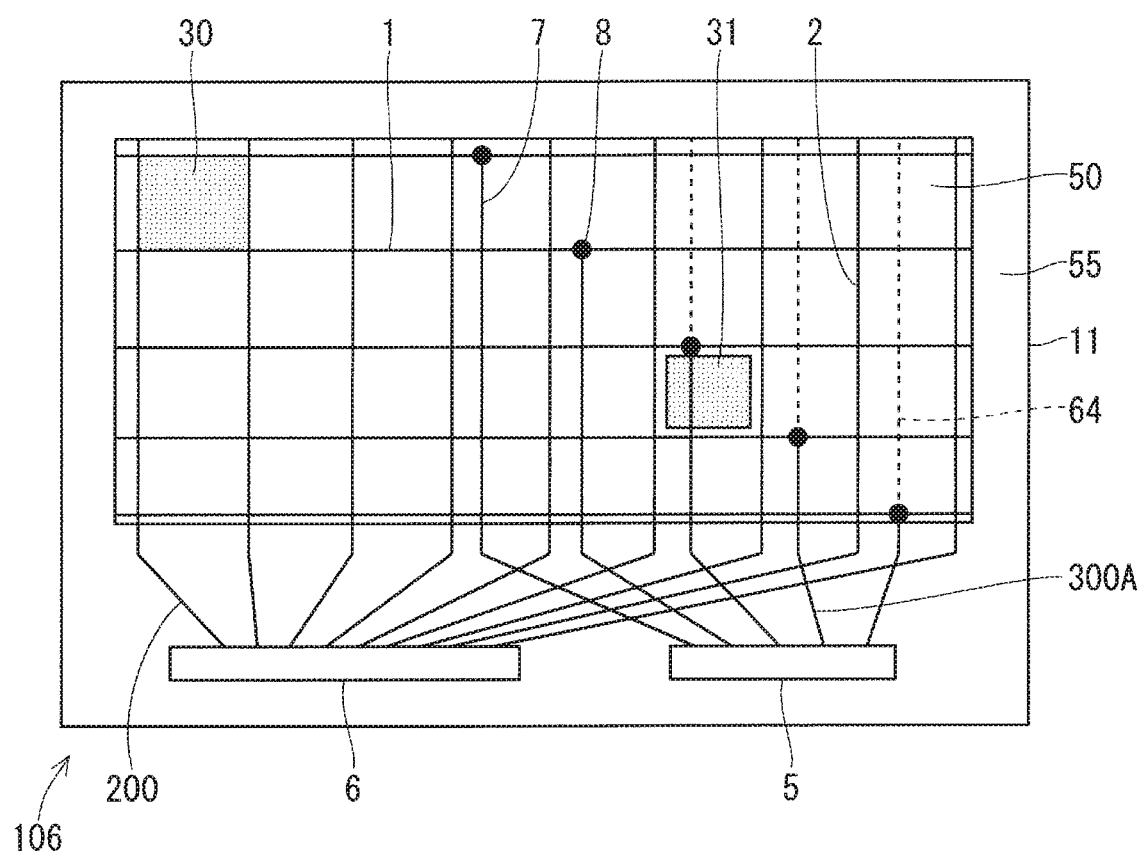
F I G. 1 4

DISPLAY APPARATUS

BACKGROUND OF THE INVENTION

Field of the Invention

The technology disclosed in the present specification relates to a display apparatus.

Description of the Background Art

At present, a thin display apparatus using a principle such as liquid crystal or electroluminescence is in wide use for applications such as a monitor for a personal computer, a monitor for a portable information terminal device, or a television.

In the display apparatus as described above, pixels constituting an image are arranged two-dimensionally. Each pixel includes a scanning line (i.e., gate line) that controls an ON/OFF state of a thin film transistor (i.e., TFT) provided corresponding to each pixel, and a signal line (i.e., source line) for inputting an image signal. Normally, each pixel is disposed as surrounded by intersections where the gate lines and the source lines intersect vertically.

Further, a region (i.e., frame region) around a display region on an array substrate where the TFT is disposed in plan view is provided with a lead line connecting the gate line, the source line, and a driver integrated circuit (IC), and an antistatic circuit that prevents the entry of static electricity from the lead line.

In recent years, with the widespread use of display apparatuses, functions and forms required for the display apparatuses have also diversified.

The narrowing of the frame region is one of the requirements as described above, and the purpose of narrowing the frame region is to improve the flexibility in the design of the display apparatus.

However, as in the conventional configuration, in a case where the gate lines with the same pitch are arranged in the frame region on the array substrate, the width of the frame region becomes more than [(width of gate line+interval between gate lines)×number of gate lines].

In order to further reduce the width of the frame region, for example, Japanese Patent Application Laid-Open No. 2014-119746 proposes a configuration in which vertical gate lines are arranged parallel to source lines in the display region, and vertical gate lines are connected to the gate lines arranged vertically to the vertical gate lines. With such a configuration, the (vertical) gate line can be routed in the display region as well.

With such a configuration, the gate line is not arranged in the right and left frame regions where the gate line has been arranged in the conventional configuration.

Here, in the configuration as described above, it is necessary to connect the vertical gate line and the gate line at a connection part.

However, when the gate signal is switched ON/OFF, a charge/discharge current is generated in the vertical gate line. In particular, a large current flows through the connection part near the input side where a line load is small. For this reason, Joule heat is generated by the resistance of the connection part. As a result, the heat causes thermal denaturation of the material for the connection part, which is visually recognized as a display failure due to the opening of the connection part (gate opening).

SUMMARY

Japanese Patent Application Laid-Open No. 2014-119746 discloses a display apparatus for routing the vertical gate line in the display region, but with such a configuration, the time constant of the vertical gate line, which is an index of the line load of the vertical gate line, is different significantly between the vertical gate line formed at a position where the connection part is close to the input side and the vertical gate line formed at a position where the connection part is far from the input side. Specifically, the time constant of the vertical gate line formed at a position where the connection part is close to the input side and the time constant of the vertical gate line formed at a position where the connection part is far from the input side are different by thousands to ten thousands of times.

In particular, when a charge/discharge current generated at the time of the on/off switch of the gate signal increases in the vertical gate line formed at a position where the connection portion is formed at a position near the input side and the opening of the connection part (gate opening) occurs due to Joule heat, a display failure occurs, which has been problematic.

An object of the technique disclosed in the present specification is to provide a technique for preventing a display failure caused by heat generated in a vertical gate line.

A first aspect of the technology disclosed in the present specification is a display apparatus including: a plurality of gate lines arranged in a display region on an array substrate; a plurality of vertical gate lines arranged in the display region and orthogonal to the gate lines; and a plurality of connection parts, each of which connects one of the gate lines and corresponding one of the vertical gate lines. The plurality of vertical gate lines extend from a first side in the display region, and at least the gate line disposed closest to the first side is connected to the corresponding vertical gate line by the plurality of connection parts disposed at two or more locations.

Further, the second aspect of the technology disclosed in the present specification is a display apparatus including: a plurality of first gate lines arranged in a display region on an array substrate; a plurality of vertical gate lines arranged in the display region and orthogonal to the first gate lines; and a plurality of connection parts that connect some of the first gate lines and corresponding ones of the vertical gate lines. The plurality of vertical gate lines extend from a first side in the display region, and at least the first gate line disposed closest to the first side is not connected to the connection part or the vertical gate line.

Further, the third aspect of the technology disclosed in the present specification is a display apparatus including: a plurality of first gate lines arranged in a display region on an array substrate; a plurality of vertical gate lines arranged in the display region, extending from the first side in the display region, and orthogonal to the first gate lines; a plurality of connection parts, each of which connects one of the first gate lines and corresponding one of the vertical gate lines; and a plurality of second gate lines arranged in a frame region surrounding the display region in plan view and connected to the respective vertical gate lines on the first side. The connection part disposed closest to the first side is a first connection part, the vertical gate line connected to the first connection part is a first vertical gate line, and the display apparatus further comprises a conductive film disposed in the frame region and overlapping with at least the second gate lines connected to the first vertical gate lines in plan view.

Further, the fourth aspect of the technology disclosed in the present specification is a display apparatus including: a plurality of first gate lines arranged in a display region on an array substrate; a plurality of vertical gate lines arranged in the display region, extending from the first side in the display region, and orthogonal to the first gate lines; a plurality of connection parts, each of which connects one of the first gate lines and corresponding one of the vertical gate lines; and a plurality of second gate lines arranged in a frame region surrounding the display region in plan view and connected to the respective vertical gate lines on the first side. The connection part disposed closest to the first side is a first connection part, the vertical gate line connected to the first connection part is a first vertical gate line, and at least a line width of one of the second gate lines that is connected to the first vertical gate line is smaller than line widths of the other second gate lines.

Further, the fifth aspect of the technology disclosed in the present specification is a display apparatus including: a plurality of first gate lines arranged in a display region on an array substrate; a plurality of vertical gate lines arranged in the display region, extending from the first side in the display region, and orthogonal to the first gate lines; a plurality of connection parts, each of which connects one of the first gate lines and corresponding one of the vertical gate lines; and a plurality of second gate lines arranged in a frame region surrounding the display region in plan view and is connected to the respective vertical gate lines on the first side. The connection part disposed closest to the first side is a first connection part, the vertical gate line connected to the first connection part is a first vertical gate line, and at least one of the second gate lines that is connected to the first vertical gate line has a zigzag shape.

Further, the sixth aspect of the technology disclosed in the present specification is a display apparatus including: a plurality of gate lines arranged in a display region on an array substrate; a plurality of vertical gate lines arranged in the display region and orthogonal to the gate lines; a plurality of connection parts, each of which connects one of the gate lines and corresponding one of the vertical gate line; and a plurality of extension parts connected to the respective connection parts and arranged parallel to the vertical gate lines. The plurality of vertical gate lines extend from a first side in the display region, and the plurality of extension parts extend to a side opposite to the first side in the display region.

According to the first aspect of the technique disclosed in the present specification, the current to be input is dispersed by providing, at two or more locations, the connection parts for connecting to one gate line disposed near the first side. Therefore, the charge/discharge current to be input into the connection part can be reduced, thus preventing a display failure caused by heat generated in the vertical gate line.

Further, according to the second aspect of the technology disclosed in the present specification, the first gate line disposed closest to the first side does not include the connection part. It is thus possible to prevent a large amount of heat from being generated at the connection part due to a small line load.

Further, according to the third aspect of the technique disclosed in the present specification, a parasitic capacitance is generated between the conductive film and the second gate line. Hence the parasitic capacitance increases the line load on the second gate line and further on the first vertical gate line connected to the second gate line. Then, the heat generation in the line can be reduced.

Further, according to the fourth aspect of the technique disclosed in the present specification, the line resistance of the second gate line increases. Hence the line resistance leads to an increase in line load of the first vertical gate line connected to the second gate line. Then, the heat generation in the line can be reduced.

Further, according to the fifth aspect of the technology disclosed in the present specification, the line resistance of the second gate line connected to the first vertical gate line increases, thereby leading to an increase in line load of the vertical gate line. Then, the heat generation in the line can be reduced.

Further, according to the sixth aspect of the technique disclosed in the present specification, since the extension part connected to the vertical gate line via the connection part has the line resistance, the line load of the vertical gate line increases. Then, the heat generation in the line can be reduced.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 9 to 11 are plan views schematically showing examples of the configuration of the liquid crystal display panel in the liquid crystal display apparatus according to the preferred embodiment;

FIG. 14 is a plan view schematically showing an example of the configuration of the liquid crystal display panel in the liquid crystal display apparatus according to the preferred embodiment.

DESCRIPTION OF THE PREFERRED EMBODIMENTS

Hereinafter, preferred embodiments will be described with reference to the attached drawings.

Note that the drawings are schematically shown, and omission of the configuration or simplification of the configuration may be made as appropriate for the convenience of description. The interrelationships among sizes and positions of configurations and the like shown in different drawings are not necessarily accurately described but may be changed as appropriate. Further, even in drawings such as plan views that are not cross-sectional views, hatching may be given to facilitate understanding of the contents of the preferred embodiments.

Moreover, in the description shown below, similar components are shown with the same symbol, and it is assumed that this also applies to the names and functions of those components. Accordingly, detailed descriptions of those may be omitted to avoid duplication.

Also, in the description described below, even when a term meaning a specific position or a direction, such as "upper", "lower", "left", "right", "side", "bottom", "front", or "back" is used, these terms are to be used for the sake of convenience to facilitate understanding of the contents of the preferred embodiments and are not related to directions in actual implementation.

In addition, in the description described below, even when an ordinal number such as "first" or "second" is used, these terms are to be used for the sake of convenience to facilitate understanding of the contents of the preferred embodiments, and the order or the like which may occur by these ordinal numbers is not restrictive.

In the following preferred embodiments, as an array substrate, for example, one is shown in which a bottom gate TFT is mounted as a switching device used in a liquid crystal display apparatus. However, the apparatus is not limited to the liquid crystal display apparatus or the bottom gate TFT described above, but any apparatus is applicable even having other configurations, so long as being a display apparatus capable of active matrix driving.

First Preferred Embodiment

Hereinafter, a display apparatus according to the present preferred embodiment will be described. For convenience of description, first, a configuration of a liquid crystal display panel and a configuration of a pixel in the liquid crystal display apparatus as a display apparatus will be described.

<Regarding Configuration of Liquid Crystal Display Panel>

Figure 1:
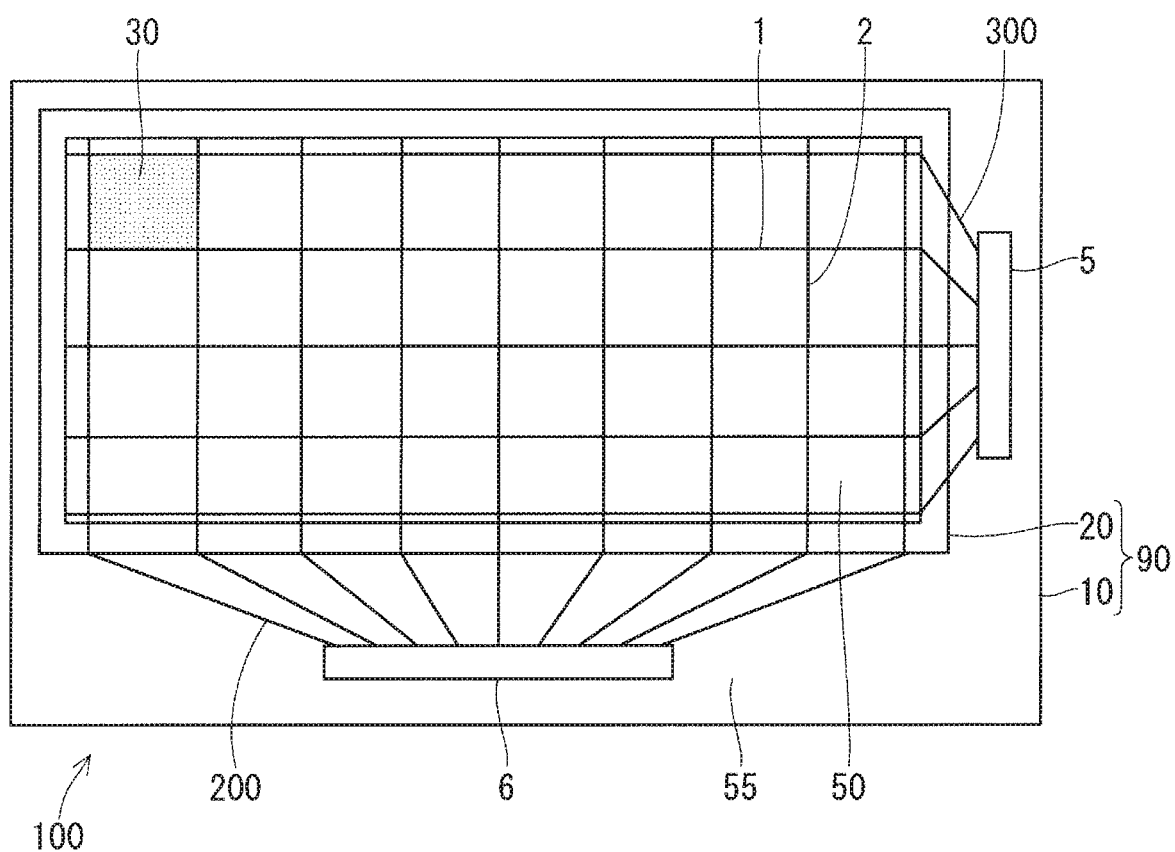
FIG. 1 is a plan view schematically showing an example of a configuration of a liquid crystal display panel in a liquid crystal display apparatus.

FIG. 1 is a plan view schematically showing an example of the configuration of the liquid crystal display panel in the liquid crystal display apparatus.

As shown in the example of FIG. 1, a liquid crystal display apparatus 100 includes a liquid crystal display panel 90 or the like as the main part.

The liquid crystal display panel 90 includes an array substrate 10 and a counter substrate 20. Then, a liquid crystal is sealed between the array substrate 10 and the counter substrate 20.

On the array substrate 10, a plurality of pixels 30 constituting a display region 50 are arranged in a matrix. Specifically, the display region 50 is configured to include: a plurality of gate lines 1, a plurality of source lines 2 wired vertically to the gate lines 1, a TFT that is a switching element disposed corresponding to each pixel 30 surrounded by intersections of the gate lines 1 and the source lines 2, a common electrode, and a pixel electrode.

The counter substrate 20 is disposed on the upper surface of the array substrate 10 at a position corresponding to the display region 50 in plan view. On the counter substrate 20, a color filter, a black matrix, or the like is formed. The color filter or the black matrix may be formed on the array substrate 10.

The liquid crystal display panel 90 is roughly divided into the display region 50 and a frame region 55 formed around the display region 50 in plan view. In the frame region 55, a gate driver IC 5 and a source driver TC 6 may be mounted. In FIG. 1, the gate driver IC 5 is mounted on a portion of the frame region 55 located on the right side of the display region 50, and the source driver IC 6 is mounted on a portion of the frame region 55 located below the display region 50.

The plurality of gate lines 1 in the display region 50 are connected to the gate driver IC 5 via gate taper lines 300 in the frame region 55.

Note that the "taper" of the gate taper line 300 is an expression indicating that in FIG. 1, a plurality of lines connecting the gate driver IC 5 and the gate lines 1 in the display region 50 are arranged in a shape as if a fan was opened.

In the present preferred embodiment, the gate line in the frame region 55 is referred to as a gate taper line 300, but the shape of the gate line in the frame region 55 is not limited to the taper shape, but the gate line may be wired in various shapes.

In addition, the plurality of source lines 2 in the display region 50 are connected to the source driver IC 6 via source taper lines 200 in the frame region 55.

In the liquid crystal display apparatus 100, a polarizing plate or a retardation plate is attached to both sides of the liquid crystal display panel 90, and a touch panel or a protective plate is attached to the surface of the liquid crystal display panel 90, as necessary. Here, both sides of the liquid crystal display panel 90 refer to surfaces opposite to the surfaces facing each other in the array substrate 10 and the counter substrate 20.

Further, an external circuit is connected to the liquid crystal display panel 90, and the liquid crystal display panel 90 is housed in a housing together with a back-light source (i.e., backlight) or an optical sheet.

Figure 2:
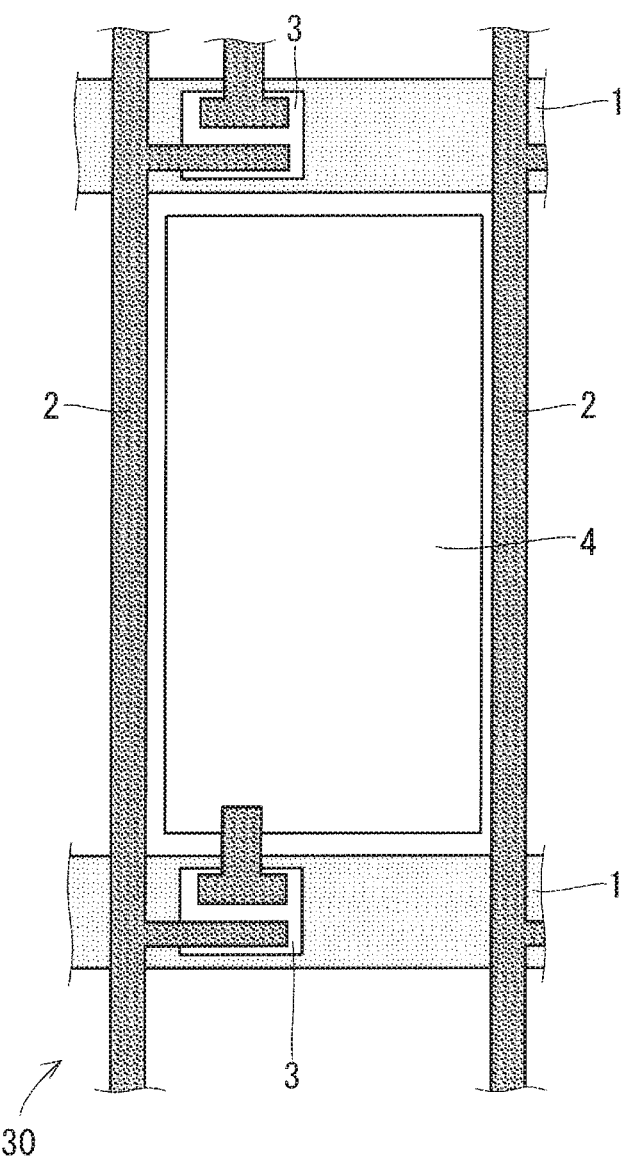
FIG. 2 is a plan view schematically showing an example of a configuration of a pixel in the liquid crystal display apparatus shown by an example in FIG. 1.

FIG. 2 is a plan view schematically showing an example of the configuration of the pixel in the liquid crystal display apparatus shown by an example in FIG. 1.

As shown in the example of FIG. 2, each pixel 30 in the display region includes the gate lines 1 and the source lines 2 that are wired orthogonally, a TFT 3 disposed near the intersections of the gate lines 1 and the source lines 2, and a pixel electrode 4 connected to the drain terminal of the TFT 3.

Figure 3:
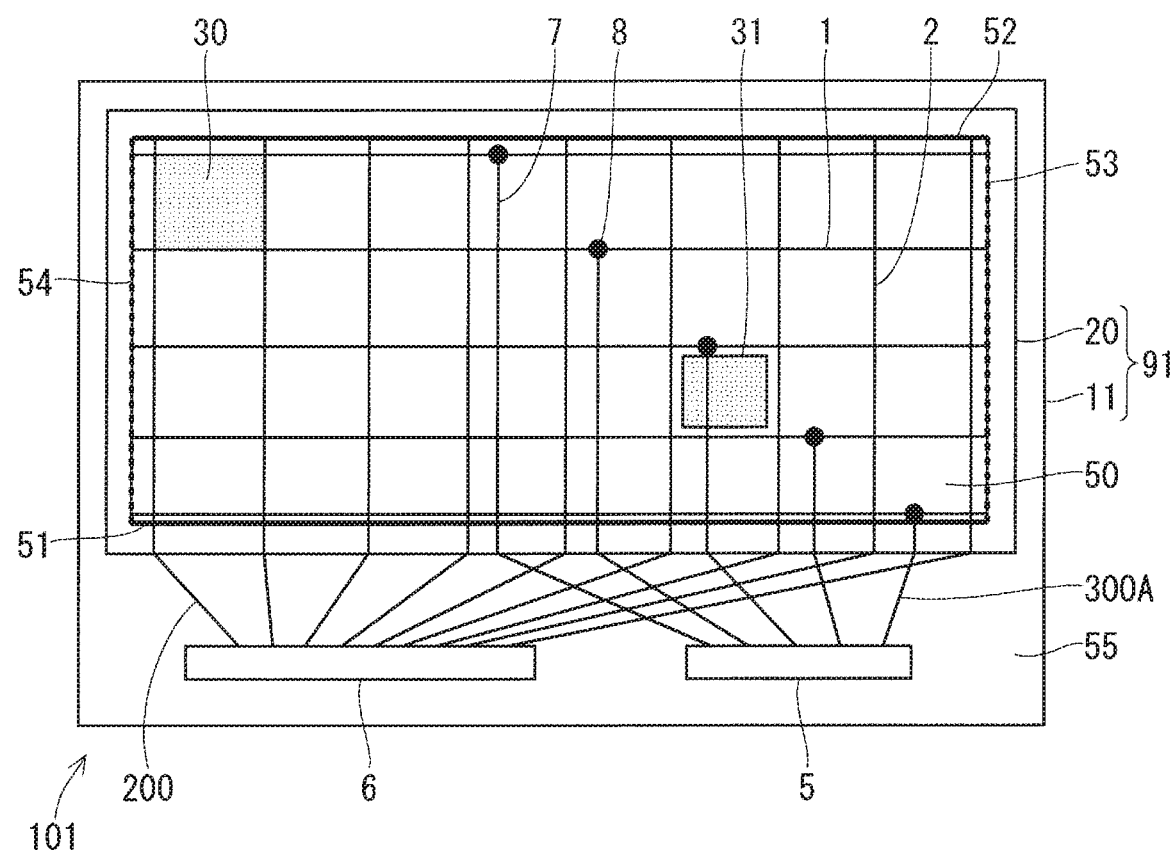
FIG. 3 is a plan view schematically showing another example of the configuration of the liquid crystal display panel in the liquid crystal display apparatus.

FIG. 3 is a plan view schematically showing another example of the configuration of the liquid crystal display panel in the liquid crystal display apparatus.

As shown in the example of FIG. 3, a liquid crystal display apparatus 101 includes a liquid crystal display panel 91 or the like as the main part.

The liquid crystal display panel 91 includes an array substrate 11 and a counter substrate 20. Then, a liquid crystal is sealed between the array substrate 11 and the counter substrate 20.

On the array substrate 11, a plurality of pixels 30 and a plurality of pixels 31 constituting a display region 50 are arranged in a matrix. Specifically, the display region 50 is configured to include: a plurality of gate lines 1, a plurality of source lines 2, a TFT that is a switching element disposed corresponding to each pixel 30 and pixel 31 surrounded by intersections of the gate lines 1 and the source lines 2, a vertical gate line 7 wired parallel to the source line 2, a connection part 8 that connects the vertical gate line 7 and the gate line 1, a common electrode, and a pixel electrode.

Each pixel 30 is disposed as surrounded by intersections where the gate lines 1 and the source lines 2 intersect vertically. In addition, each pixel 31 is disposed as surrounded by intersections where the gate lines 1 and the source lines 2 intersect vertically, and each pixel 31 is provided with the vertical gate line 7 and the connection part 8 that connects the vertical gate line 7 and the gate line 1.

The liquid crystal display panel 91 is roughly divided into the display region 50 and a frame region 55 formed around the display region 50 in plan view. In the frame region 55, a gate driver IC 5 and a source driver IC 6 may be mounted. In FIG. 3, the gate driver IC 5 is mounted on a portion of the frame region 55 located below the display region 50, and a source driver IC 6 is mounted on a portion of the frame region 55 located below the display region 50.

The plurality of vertical gate lines 7 in the display region 50 are connected to the gate driver IC 5 via gate taper lines 300A in the frame region 55.

In addition, the plurality of source lines 2 in the display region 50 are connected to the source driver IC 6 via source taper lines 200 in the frame region 55.

Figure 4:
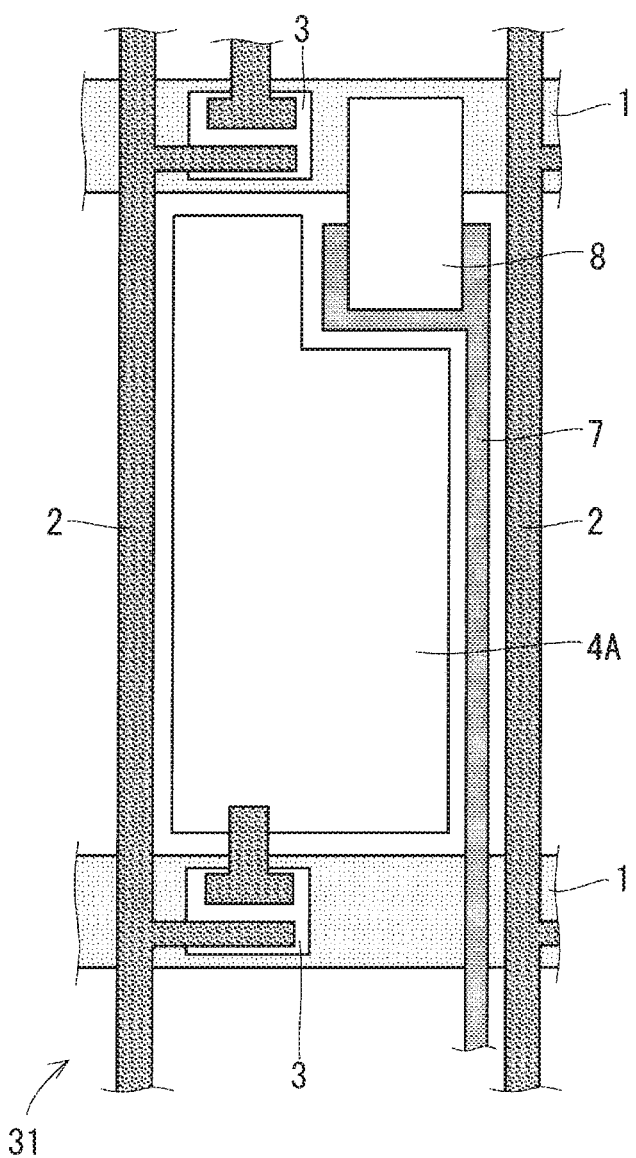
FIG. 4 is a plan view schematically showing an example of a configuration of a pixel in the liquid crystal display apparatus shown by an example in FIG. 3.

FIG. 4 is a plan view schematically showing an example of the configuration of the pixel in the liquid crystal display apparatus shown by an example in FIG. 3.

As shown in the example of FIG. 4, each pixel 31 in the display region includes the gate lines 1 and the source lines 2 that are wired orthogonally, the TFT 3 disposed near the intersections of the gate lines 1 and the source lines 2, and a pixel electrode 4A connected to the drain terminal of the TFT 3, the vertical gate line 7 wired parallel to the source line 2, and the connection part 8 that connects the vertical gate line 7 and the gate line 1.

Here, the connection part 8 shown by an example in FIG. 4 will be considered.

A gate signal is transmitted to the connection part 8, but there is a large difference in line load between the vertical gate line 7 where the connection part 8 is located near the input side and the vertical gate line 7 where the connection part 8 is located near the opposite input side.

Here, the input side is a side located on the side closest to the gate driver IC 5 that outputs the gate signal, and in FIG. 3, the input side corresponds to a lower side 51 of the drawing.

Further, the connection part 8 located near the input side refers to the connection part 8 having a relatively short vertical gate line 7 extending from the input side, and the connection part 8 located near the opposite input side refers to the connection part 8 having a relatively long vertical gate line 7 extending from the input side Here, the opposite input side is a side that is located on the side farthest from the gate driver IC 5, and in FIG. 3, the opposite input side corresponds to a side 52 that faces the side 51 across the display region 50 on the upper side of the drawing.

As an example, for a display apparatus with a resolution of full high definition (FHD) (1980×1080), when the resistance of the vertical gate line 7 per pixel is $R_g$, the parasitic capacitance of the vertical gate line 7 per pixel is $C_g$, and the number of pixels from the input side of the vertical gate line 7 to the connection part 8 is n, the line load can be compared using a signal delay, that is, a time constant τ.

Since the resistance of the vertical gate line 7 to the n-th pixel connection part 8 is $nR_g$ and the parasitic capacitance of the vertical gate line 7 to the connection part 8 at an nth-pixel is $nC_g$, the time constant τ is expressed as in the following Equation (1):

[Mathematical Equation 1]

$$\tau = n^2 R_g C_g \tag{1}$$

Therefore, when the line load of the vertical gate line 7 where the connection part 8 is located near the input side (e.g., the first pixel from the lower input side) is $\tau_n$, and the line load of the vertical gate line 7 where the connection part 8 is located near the opposite input side (e.g., the 1080th pixel upward from the lower input side) is $\tau_f$, the ratio of the line load of the vertical gate line 7 can be expressed by the following Equation (2):

[Mathematical Equation 2]

$$\tau_f/\tau_n = (n_f^2 R_g C_g)/(n_n^2 R_g C_g) \approx 10^6 \tag{2}$$

As described above, there is a large difference between the line load of the vertical gate line 7 where the connection part 8 is located near the input side and the line load of the vertical gate line 7 where the connection part 8 is located near the opposite input side. When there is a large difference in line load, a large difference occurs in the delay of the gate signal.

Figure 5:
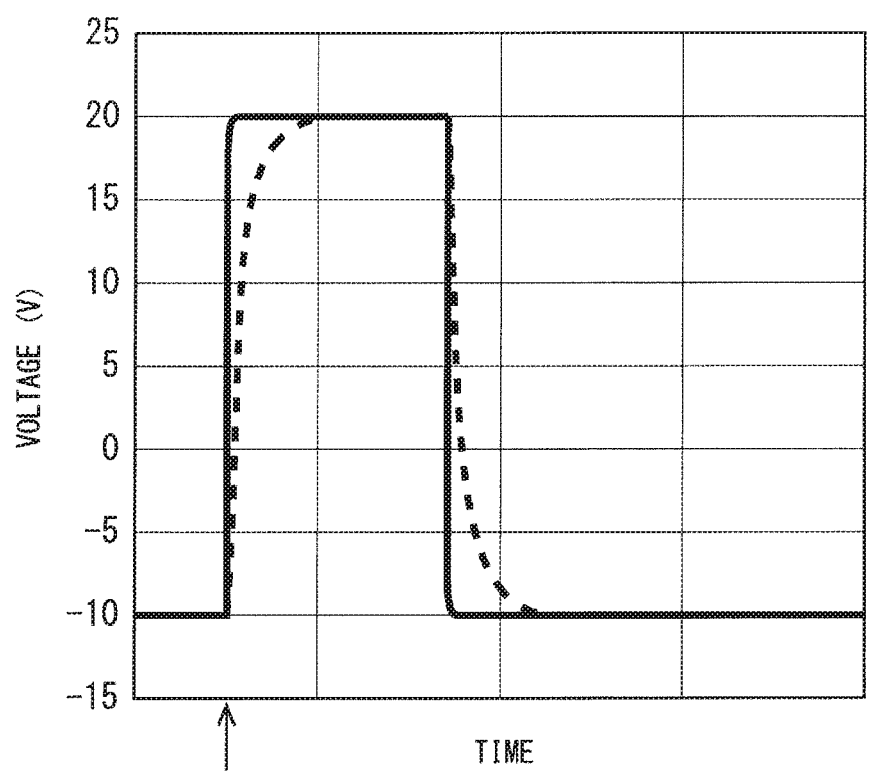
FIG. 5 is a diagram showing voltage values of a gate signal of the liquid crystal display panel in the liquid crystal display apparatus shown by an example in FIG. 3.

FIG. 5 is a diagram showing voltage values of a gate signal of the liquid crystal display panel in the liquid crystal display apparatus shown by the example in FIG. 3. In FIG. 5, the vertical axis indicates voltage [V], and the horizontal axis indicates time.

In FIG. 5, the voltage value of the gate signal which is input into the vertical gate line 7 where the connection part 8 is located near the input side is indicated by a solid line, and the voltage value of the gate signal which is input into the vertical gate line 7 where the connection part 8 is located near the opposite input side is indicated by a dotted line.

The current is the amount of charge that flows per unit time. Therefore, when the delay of a voltage signal is small and the rise of the voltage signal is steep, charging/discharging is performed quickly, and as a result, the current increases.

Figure 6:
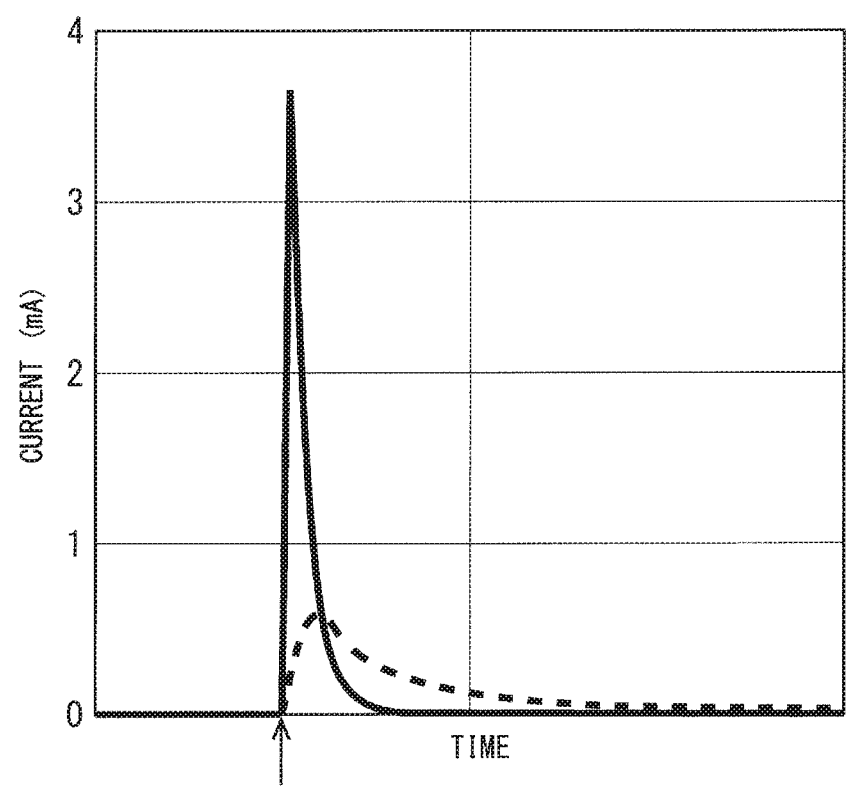
FIG. 6 is a diagram showing current values in a gate conversion part of the liquid crystal display panel in the liquid crystal display apparatus shown by an example in FIG. 3.

FIG. 6 is a diagram showing current values in a gate conversion part (i.e., the connection part of the gate line and the vertical gate line) of the liquid crystal display panel in the liquid crystal display apparatus shown by the example in FIG. 3. In FIG. 6, the vertical axis indicates current [mA], and the horizontal axis indicates time.

In FIG. 6, the current value in the vertical gate line 7 where the connection part 8 is located near the input side is indicated by a solid line, and the current value in the vertical gate line 7 where the connection part 8 is located near the opposite input side is indicated by a dotted line. Also, the arrow indicated on the horizontal axis (time axis) in FIG. 6 shows the same time as that of the arrow indicated on the horizontal axis (time axis) in FIG. 5

As shown in FIG. 6, a difference of about 3 mA occurs in the current flowing through the connection part 8 of the liquid crystal display panel 91 between the vertical gate line 7 where the connection part 8 is located near the input side and the vertical gate line 7 where the connection part 8 is located near the opposite input side. Further, the difference in the amount of heat generated instantaneously at each connection part 8 is about 50 times.

Thus, for preventing the connection part 8 located near the input side from being opened (gate open) due to heat generation, it is necessary to reduce the current flowing through the connection part 8 located near the input side.

Figure 7:
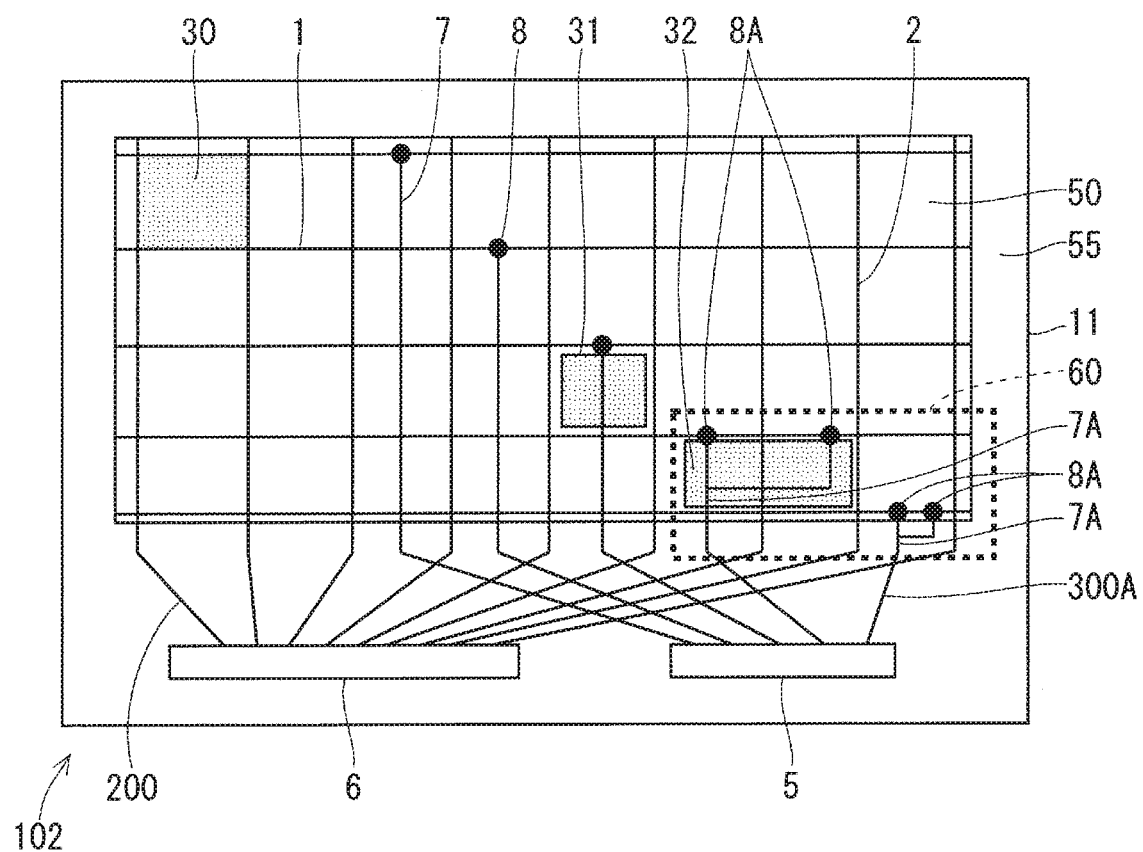
FIG. 7 is a plan view schematically showing an example of a configuration of a liquid crystal display panel in a liquid crystal display apparatus according to a preferred embodiment.

FIG. 7 is a plan view schematically illustrating an example of a configuration of a liquid crystal display panel in a liquid crystal display apparatus according to the present preferred embodiment. In FIG. 7, the counter substrate is not shown in order to improve the discrimination of the drawing.

As shown in the example of FIG. 7, a liquid crystal display apparatus 102 includes a liquid crystal display panel or the like as the main part.

The liquid crystal display panel includes the array substrate 11 and the counter substrate. Then, a liquid crystal is sealed between the array substrate 11 and the counter substrate.

On the array substrate 11, a plurality of pixels 30, a plurality of pixels 31, and at least one pixel 32 constituting the display region 50 are arranged in a matrix. Specifically, the display region 50 is configured to include: a plurality of gate lines 1, a plurality of source lines 2, a TFT that is a switching element disposed corresponding to each pixel 30, pixel 31, and pixel 32 surrounded by intersections of the gate lines 1 and the source lines 2, a plurality of vertical gate lines 7 wired parallel to the source line 2, a plurality of vertical gate lines 7A wired parallel to the source line 2, a plurality of connection parts 8 that connect the respective vertical gate lines 7 and the respective gate lines 1, a plurality of connection parts 8A that connect the respective vertical gate lines 7A and the respective gate lines 1, and a common electrode, and a pixel electrode.

The vertical gate line 7 and the vertical gate line 7A extend from the input side (i.e., lower side in FIG. 7) in the display region 50.

Among the above, the vertical gate line 7 and the vertical gate line 7A are orthogonal to the gate line 1. Note that "orthogonal" in the present specification includes substantially orthogonal (i.e., practically orthogonal) that is shifted by several degrees from strict orthogonal. Similarly, "parallel" in the present specification includes substantially parallel (i.e., practically parallel) that is shifted by several degrees from strict parallel. Similarly, "vertical" in the present specification includes substantially vertical (i.e., practically vertical) that is shifted by several degrees from strict vertical.

The vertical gate line 7 and the vertical gate line 7A in the display region 50 are connected to the gate driver IC 5 via the gate taper line 300A in the frame region 55.

In addition, the plurality of source lines 2 in the display region 50 are connected to the source driver IC 6 via source taper lines 200 in the frame region 55.

In FIG. 7, the connection part 8A of the vertical gate line 7A is disposed only in a region 60 that is a region near the input side in the display region 50. Here, two vertical gate lines 7A in FIG. 7 are connected to the gate line 1 disposed closest to the input side and the gate line 1 disposed second closest to the input side, respectively, via the connection part 8A.

Two or more connection parts 8A of the vertical gate line 7A are provided for one vertical gate line 7A. That is, the connection parts 8A of the vertical gate line 7A connect the vertical gate line 7A and the gate lines 1 at two or more locations.

Here, in FIG. 7, the connection parts 8A of the vertical gate line 7A are disposed across two pixels, but two or more connection parts 8A may be disposed in a region corresponding to one pixel.

Figure 8:
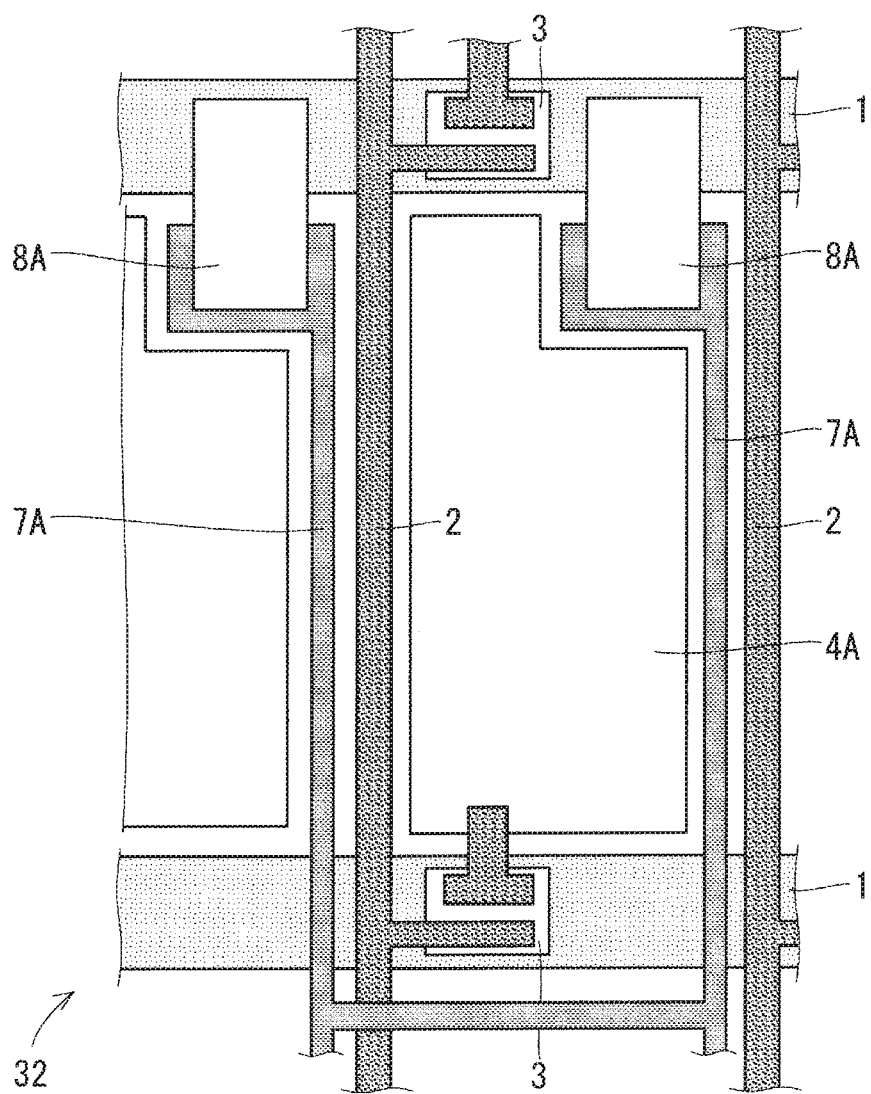
FIG. 8 is a plan view schematically showing an example of a configuration of a pixel in the liquid crystal display apparatus shown by an example in FIG. 7.

FIG. 8 is a plan view schematically showing an example of the configuration of the pixel in the liquid crystal display apparatus shown by an example in FIG. 7.

As shown in the example of FIG. 8, each pixel 32 in the display region includes the gate lines 1 and the source lines 2 that are wired orthogonally, the TFT 3 disposed near the intersections of the gate lines 1 and the source lines 2, the pixel electrode 4A connected to the drain terminal of the TFT 3, the vertical gate lines 7A wired parallel to the source line 2, and the connection parts 8A that connect the vertical gate lines 7A and the gate line 1 at two locations.

In FIG. 8, the vertical gate line 7A is bifurcated near the gate line 1, and the respective lines after branching extend parallel to the source line 2. The connection part 8A that is the respective end portions are connected to the gate line 1.

As described above, the current to be input is dispersed by branching the vertical gate line 7A into a plurality of lines and connecting the branched vertical gate lines with the gate line 1 in the plurality of connection parts 8A at the branch destination. Therefore, the charge/discharge current to be input into each connection part 8A can be reduced.

It is desirably configured such that, as for the number of connection parts 8A in each vertical gate line 7A, the vertical gate line 7A located near the input side has the largest number of connection parts 8A, and as the position of the connection part 8A separates from the vicinity of the input side, the number of connection parts 8A in the line 7A decreases gradually.

That is, the number of connection parts 8A between each gate line 1 and the corresponding vertical gate line 7A becomes the same as or larger than the number of connection parts 8A on the gate line 1 at a position further from the input side as the gate line 1 approaches the input side.

In particular, a large amount of heat generation occurs in the vertical gate line 7A where the connection part 8A is disposed at a position closest to the input side. It is thus desirable that at least two or more connection parts 8A be formed on the vertical gate line 7A closest to the input side. Further, there may be a case where the vertical gate line 7A except for the vertical gate line 7A closest to the input side includes only one connection part 8A.

Here, as a modification of the above aspect, it is possible to assume an aspect in which two vertical gate lines are extended parallel to the source line 2 and connected to the gate line 1, respectively, without branching.

However, in the aspect shown by the example in FIG. 7 and FIG. 8, the distance that the source line 2 and the two vertical gate lines extend in parallel can be shortened as compared with the above modification, and it is thus advantageous in terms of rate or capacitive coupling.

Second Preferred Embodiment

A display apparatus according to the present preferred embodiment will be described. In the following description, components similar to the components described in the preferred embodiment described above will be shown with the same reference numerals, and a detailed description thereof will be omitted as appropriate.

Figure 9:
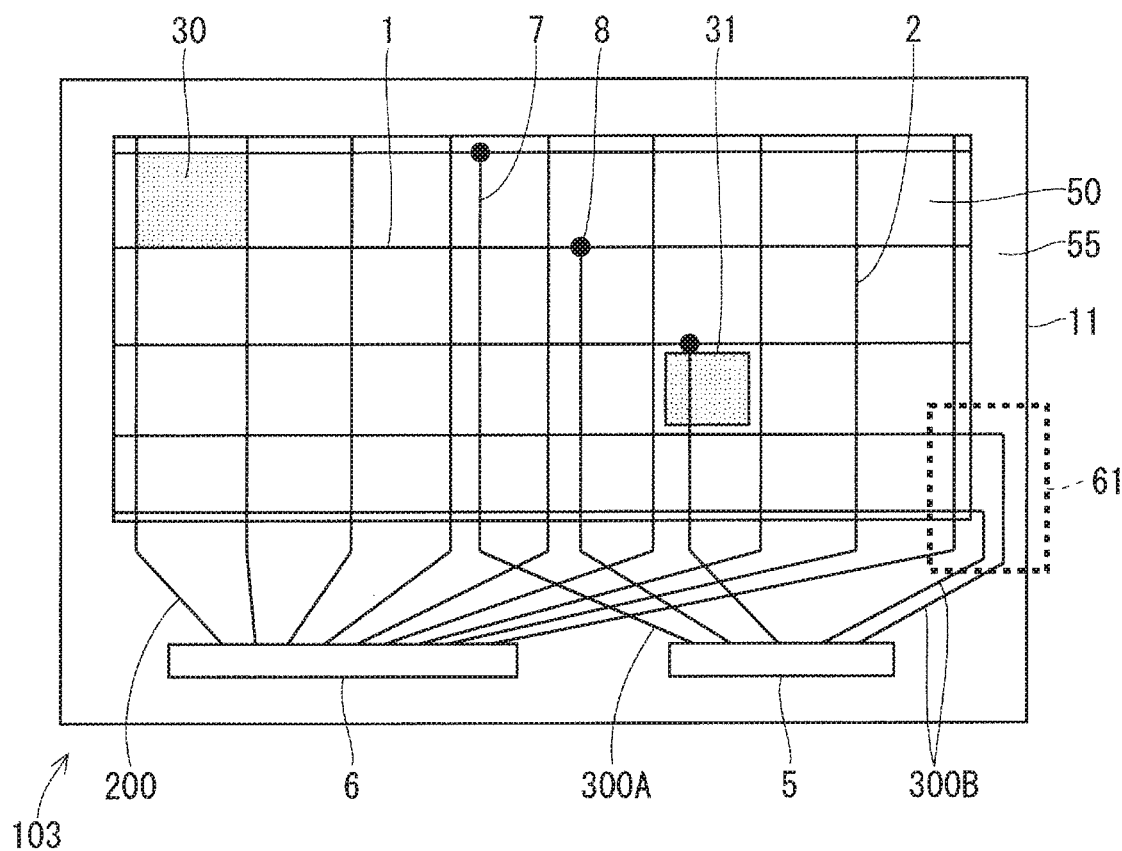

FIG. 9 is a plan view schematically showing an example of a configuration of a liquid crystal display panel in a liquid crystal display apparatus according to the present preferred embodiment. In FIG. 9, the counter substrate is not shown in order to improve the discrimination of the drawing.

As shown in the example of FIG. 9, a liquid crystal display apparatus 103 includes a liquid crystal display panel and the like as the main part.

The liquid crystal display panel includes the array substrate 11 and the counter substrate. Then, a liquid crystal is sealed between the array substrate 11 and the counter substrate.

On the array substrate 11, a plurality of pixels 30 and a plurality of pixels 31 constituting a display region 50 are arranged in a matrix. Specifically, the display region 50 is configured to include: a plurality of gate lines 1, a plurality of source lines 2, a TFT that is a switching element disposed corresponding to each pixel 30 and pixel 31 surrounded by intersections of the gate lines 1 and the source lines 2, a plurality of vertical gate lines 7 wired parallel to the source line 2, a plurality of connection parts 8 that connect the respective vertical gate lines 7 and the respective gate lines 1, a common electrode, and a pixel electrode.

Some vertical gate lines 7 in the display region 50 are connected to the gate driver IC 5 via gate taper lines 300A in the frame region 55.

On the other hand, the gate line 1 disposed near the input side except for the above is not connected to the vertical gate line 7 but is connected to the gate driver IC 5 via a gate taper line 300B in the frame region 55.

In FIG. 9, the gate line 1 disposed closest to the input side and the gate line 1 disposed second closest to the input side are both connected to the gate driver IC 5 via the gate taper lines 300B.

In addition, the plurality of source lines 2 in the display region 50 are connected to the source driver IC 6 via source taper lines 200 in the frame region 55.

Here, the gate taper line 300B is wired to a region 61 that is a region near the input side in the frame region 55. Note that the region 61 is a region in the frame region 55 corresponding to a side different from the input side (in FIG. 9, the right side in the display region 50). The gate taper line 300B then transmits a gate signal.

For example, in the case of a rectangular display apparatus as shown in the example of FIG. 3, the side different from the input side refers to three sides which are two sides disposed on the right and left sides of the plane substantially vertically to the first side (i.e., a side 53 and a side 54 in FIG. 3) and the opposite input side (i.e., the side 52 in FIG. 3).

Here, the gate taper line 300B is a line that electrically connects the gate line 1 and the gate driver IC 5 without passing through the connection part 8 and the vertical gate line 7. Specifically, the gate taper line 300B is a line formed integrally with the gate line 1 at the same time.

A large amount of heat is generated in the connection part 8 located near the input side, and in particular, located closest to the input side. It is thus desirable that the connection part 8 or the vertical gate line 7 be not connected to at least the gate line 1 closest to the input side, and that gate line 1 be connected to the gate driver IC 5 via the gate taper line 300B wired in the region 61.

Further, the gate line 1 except for the gate line 1 closest to the input side may be connected with the gate taper line 300A via the connection part 8 and the vertical gate line 7 instead of the gate taper line 300B.

Third Preferred Embodiment

A display apparatus according to the present preferred embodiment will be described. In the following description, components similar to the components described in the preferred embodiment described above will be shown with the same reference numerals, and a detailed description thereof will be omitted as appropriate.

Figure 10:
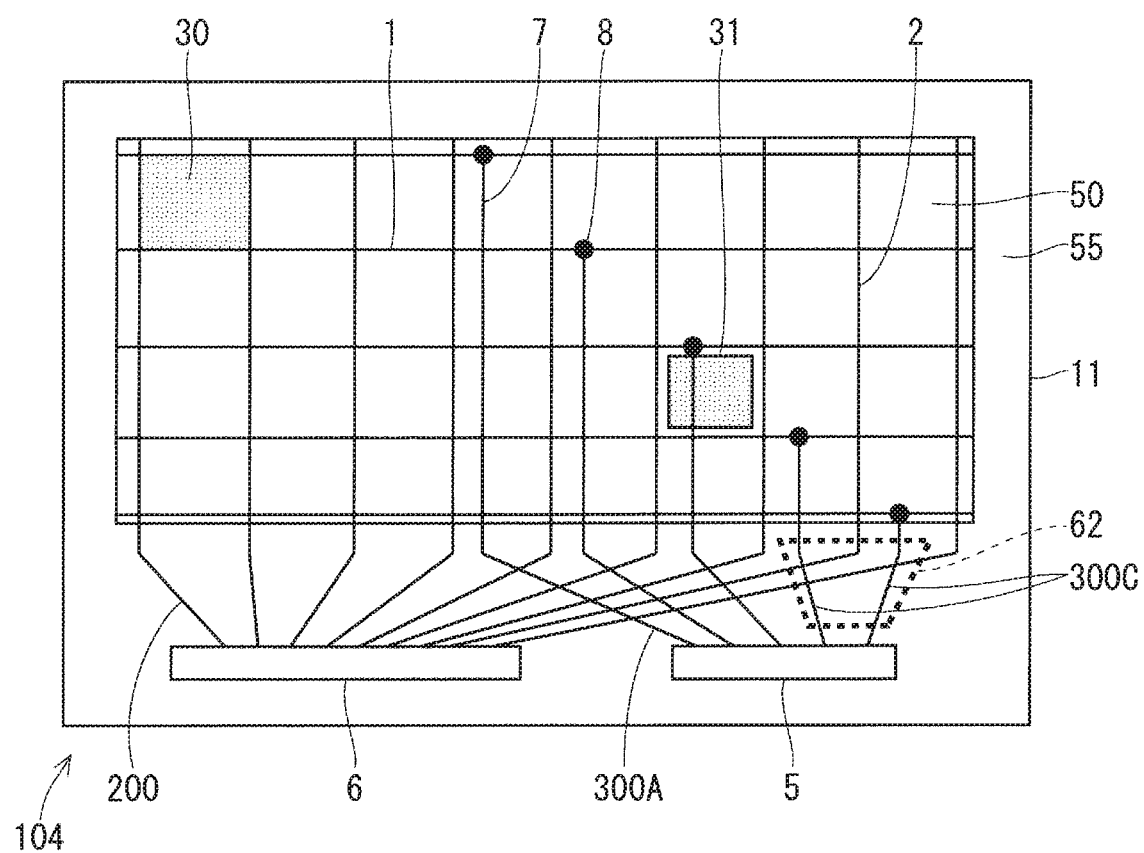

FIG. 10 is a plan view schematically illustrating an example of a configuration of a liquid crystal display panel in a liquid crystal display apparatus according to the present preferred embodiment. In FIG. 10, the counter substrate is not shown in order to improve the discrimination of the drawing.

As shown in the example of FIG. 10, a liquid crystal display apparatus 104 includes a liquid crystal display panel or the like as the main part.

The liquid crystal display panel includes the array substrate 11 and the counter substrate. Then, a liquid crystal is sealed between the array substrate 11 and the counter substrate.

On the array substrate 11, a plurality of pixels 30 and a plurality of pixels 31 constituting a display region 50 are arranged in a matrix. Specifically, the display region 50 is configured to include: a plurality of gate lines 1, a plurality of source lines 2, a TFT that is a switching element disposed corresponding to each pixel 30 and pixel 31 surrounded by intersections of the gate lines 1 and the source lines 2, a plurality of vertical gate lines 7 wired parallel to the source line 2, a plurality of connection parts 8 that connect the respective vertical gate lines 7 and the respective gate lines 1, a common electrode, and a pixel electrode.

Of the plurality of vertical gate lines 7 in the display region 50, the vertical gate line 7 except for the vertical gate line 7 where the connection part 8 is disposed near the input side is connected to the gate driver IC 5 via the gate taper line 300A in the frame region 55 corresponding to the input side.

On the other hand, the vertical gate line 7 where the connection part 8 is disposed near the input side is connected to the gate driver IC 5 via a gate taper line 300C in the frame region 55 corresponding to the input side. In FIG. 10, the vertical gate line 7 connected to the connection part 8 disposed closest to the input side and the vertical gate line 7 connected to the connection part 8 disposed second closest to the input side are connected to the gate driver IC 5 via the gate taper line 300C in the frame region 55 corresponding to the input side.

In addition, the plurality of source lines 2 in the display region 50 are connected to the source driver IC 6 via source taper lines 200 in the frame region 55.

Further, in a region overlapping with the gate taper line 300C in plan view, a conductive film 62 is formed which is a transparent conductive film of indium tin oxide (tin-doped indium oxide or indium tin oxide, that is, ITO) or the like or a metal film of Cu, Al, or the like. By forming the conductive film 62 in the region, parasitic capacitance is generated between the conductive film 62 and the gate taper line 300C. Then, the parasitic capacitance increases the line load.

It is desirably configured such that, as for the area where the transparent conductive film or the metal film overlaps with the gate taper line 300C, the gate taper line 300C connected to the vertical gate line 7 where the connection part 8 is located near the input side has the largest area, and the area where the transparent conductive film or the metal film overlaps with the gate taper line 300C is reduced as the corresponding connection part 8 separates from the vicinity of the input side.

For example, it is desirable that a parasitic capacitance of at least 30 pF or more be added to the gate taper line 300C connected to the vertical gate line 7 where the connection part 8 is located closest to the input side.

Fourth Preferred Embodiment

A display apparatus according to the present preferred embodiment will be described. In the following description, components similar to the components described in the preferred embodiment described above will be shown with the same reference numerals, and a detailed description thereof will be omitted as appropriate.

FIG. 11 is a plan view schematically illustrating an example of a configuration of a liquid crystal display panel in a liquid crystal display apparatus according to the present preferred embodiment. In FIG. 11, the counter substrate is not shown in order to improve the discrimination of the drawing.

As shown in the example of FIG. 11, a liquid crystal display apparatus 105 includes a liquid crystal display panel or the like as the main part.

The liquid crystal display panel includes the array substrate 11 and the counter substrate. Then, a liquid crystal is sealed between the array substrate 11 and the counter substrate.

On the array substrate 11, a plurality of pixels 30 and a plurality of pixels 31 constituting a display region 50 are arranged in a matrix. Specifically, the display region 50 is configured to include: a plurality of gate lines 1, a plurality of source lines 2, a TFT that is a switching element disposed corresponding to each pixel 30 and pixel 31 surrounded by intersections of the gate lines 1 and the source lines 2, a plurality of vertical gate lines 7 wired parallel to the source line 2, a plurality of connection parts 8 that connect the respective vertical gate lines 7 and the respective gate lines 1, a common electrode, and a pixel electrode.

Of the plurality of vertical gate lines 7 in the display region 50, the vertical gate line 7 except for the vertical gate line 7 where the connection part 8 is disposed near the input side is connected to the gate driver IC 5 via the gate taper line 300A in the frame region 55.

On the other hand, the vertical gate line 7 where the connection part 8 is disposed near the input side is connected to the gate driver IC 5 via a gate taper line 300D in the frame region 55.

In addition, the plurality of source lines 2 in the display region 50 are connected to the source driver IC 6 via source taper lines 200 in the frame region 55.

Here, the gate taper line 300D has larger line resistance than that of the gate taper line 300A. Since the line resistance of the gate taper line 300D is large, the line load of the vertical gate line 7 connected to the gate taper line 300D increases.

It is desirably configured such that, as for the magnitude of the line resistance of the gate taper line 300D, the gate taper line 300D connected to the vertical gate line 7 where the connection part 8 is located near the input side has the largest line resistance, and the line resistance is reduced as the corresponding connection part 8 separates from the vicinity of the input side.

For example, it is desirable that a line resistance of at least 1 kΩ or more be added to the gate taper line 300D connected to the vertical gate line 7 where the connection part 8 is located closest to the input side.

Figure 12:
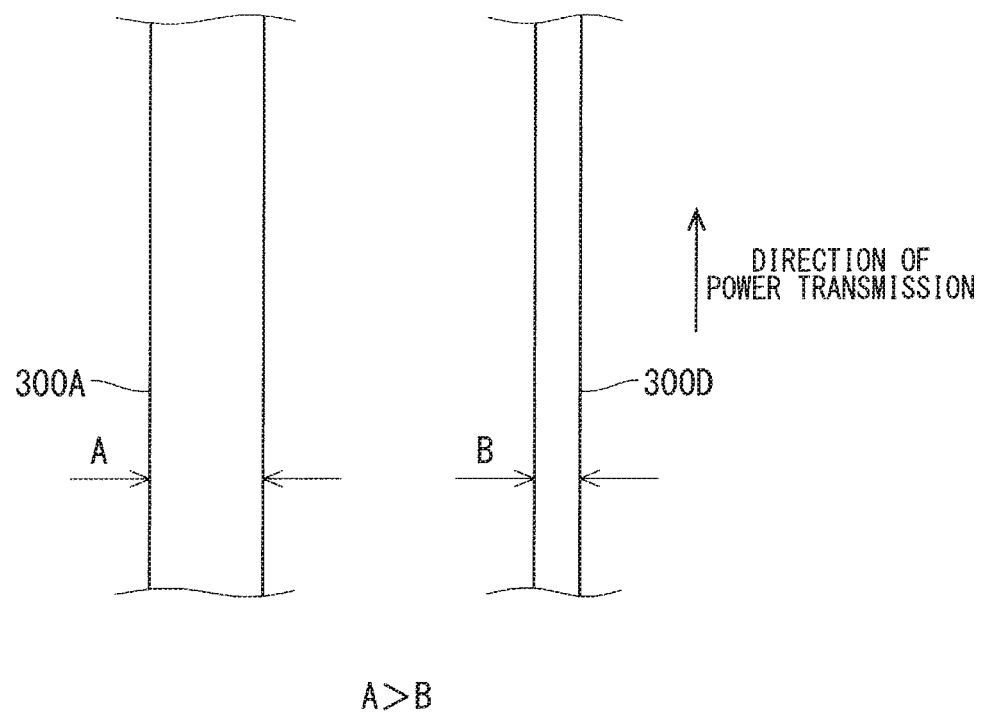
FIG. 12 is a schematic view showing an example of a specific mode in the case of an increase in line resistance of a gate taper line.

FIG. 12 is a schematic view showing an example of a specific mode in the case of an increase in line resistance of the gate taper line.

In FIG. 12, a line width B of the gate taper line 300D is smaller than a line width A of the gate taper line 300A. By forming the gate taper line 300D in this way, the line resistance of the gate taper line 300D increases.

For example, it is desirable that the line width B of the gate taper line 300D connected to the vertical gate line 7 where the connection part 8 is located closest to the input side be set to at least three quarters or less of the line width A of the gate taper line 300A.

Figure 13:
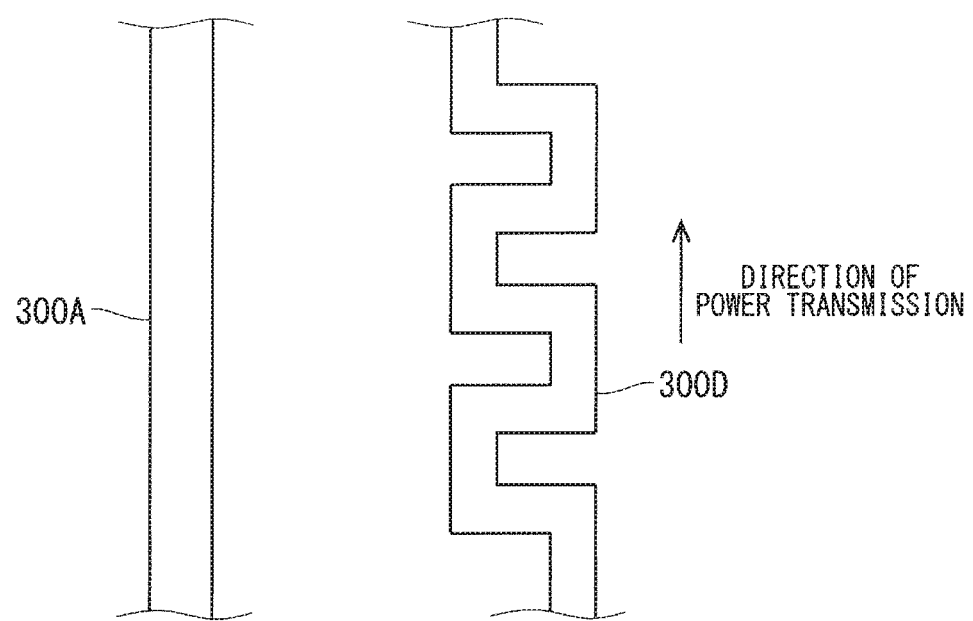
FIG. 13 is a schematic view showing another example of the specific mode in the case of an increase in line resistance of the gate taper line.

FIG. 13 is a schematic view showing another example of the specific mode in the case of an increase in line resistance of the gate taper line.

In FIG. 13, the gate taper line 300D is wired in a zigzag shape. For this reason, the line length is larger than that of the gate taper line 300A under the same conditions (e.g., under conditions that the position of the connection part 8 is equal and the connection is made to the gate driver IC 5 in the same manner). By forming the gate taper line 300D in this way, the line resistance of the gate taper line 300D increases.

For example, the line length of the gate taper line 300D connected to the vertical gate line 7 where the connection part 8 is located closest to the input side is desirably at least 4 mm larger than the line length of the gate taper line 300A under the same conditions.

Fifth Preferred Embodiment

A display apparatus according to the present preferred embodiment will be described. In the following description, components similar to the components described in the preferred embodiment described above will be shown with the same reference numerals, and a detailed description thereof will be omitted as appropriate.

FIG. 14 is a plan view schematically illustrating an example of a configuration of a liquid crystal display panel in a liquid crystal display apparatus according to the present preferred embodiment. In FIG. 14, the counter substrate is not shown in order to improve the discrimination of the drawing.

As shown in the example of FIG. 14, a liquid crystal display apparatus 106 includes a liquid crystal display panel or the like as the main part.

The liquid crystal display panel includes the array substrate 11 and the counter substrate. Then, a liquid crystal is sealed between the array substrate 11 and the counter substrate.

On the array substrate 11, a plurality of pixels 30 and a plurality of pixels 31 constituting a display region 50 are arranged in a matrix. Specifically, the display region 50 is configured to include: a plurality of gate lines 1, a plurality of source lines 2, a TFT that is a switching element disposed corresponding to each pixel 30 and pixel 31 surrounded by intersections of the gate lines 1 and the source lines 2, a plurality of vertical gate lines 7 wired parallel to the source line 2, a plurality of connection parts 8 that connect the respective vertical gate lines 7 and the respective gate lines 1, a plurality of extension parts 64 extending from the connection parts 8 of the respective vertical gate lines 7 to the side opposite to the input side, a common electrode, and a pixel electrode. Note that the extension part 64 is electrically opened at the end opposite to the end connected to the connection part 8.

Here, the extension part 64 has line resistance. Therefore, by providing the extension part 64 for each vertical gate line 7, the line load of each of the vertical gate lines 7, including the vertical gate line 7 where the connection part 8 is located near the input side, increases.

It is desirably configured such that, as for the length of the extension part 64 is the largest in extension part 64 provided on the vertical gate line 7 where the connection part 8 is located near the input side has the largest length, and the length of the extension part 64 is reduced as the corresponding connection part 8 separates from the vicinity of the input side.

<Regarding Effects Produced by Preferred Embodiments Described Above>

Next, examples of the effects produced by the preferred embodiments described above will be shown. In the following description, the effects will each be described based on the specific configuration shown by an example in the preferred embodiment described above, but the configuration may be replaced with another specific configuration shown by an example in the present specification in a range where a similar effect is produced.

Further, the replacement may be performed across a plurality of preferred embodiments. That is, there may be a case where a similar effect is produced by combining the respective configurations shown by examples in different preferred embodiments.

According to the preferred embodiment described above, the display apparatus includes a plurality of gate lines 1, a plurality of vertical gate lines 7, a plurality of vertical gate lines 7A, a plurality of connection parts 8, and a plurality of connection parts 8A. The plurality of gate lines 1 are arranged in the display region 50 on the array substrate 11. The vertical gate line 7 and the vertical gate line 7A are arranged in the display region 50. The vertical gate line 7 and the vertical gate line 7A are orthogonal to the gate line 1. The connection part 8 connects one gate line 1 and one corresponding vertical gate line 7. The connection part 8A connects one gate line 1 and one corresponding vertical gate line 7A. Here, the vertical gate line 7 and the vertical gate line 7A extend from the first side in the display region 50. At least the gate line 1 disposed closest to the first side is connected to the corresponding vertical gate line 7A by a plurality of connection parts 8A disposed at two or more locations. Here, the first side corresponds, for example, to an input side that is a side on which an input source for inputting a gate signal is located.

With such a configuration, the current to be input is dispersed by providing, at two or more locations, the connection parts 8A for connecting to one gate line 1 disposed near the input side. Therefore, the charge/discharge current to be input into the connection part 8A can be reduced, thus preventing a display failure caused by heat generated in the vertical gate line 7A.

Note that other configurations, except for these configurations, shown by examples in the present specification can be omitted as appropriate. That is, so long as at least these configurations are provided, the effects described above can be produced.

However, when at least one of the other configurations shown by examples in the present specification is added as appropriate to the configuration described above, that is, even when the other configuration shown by an example in the present specification and having not been mentioned as the configuration described above is added as appropriate, similar effects can be produced.

Further, according to the preferred embodiment described above, one of the plurality of gate lines 1 is the first gate line, and one of the plurality of gate lines 1 which is different from the first gate line is the second gate line. Here, the first gate line corresponds, for example, to the gate line 1 located third from the bottom in FIG. 7. Further, the second gate line corresponds, for example, to the gate line 1 located second from the bottom in FIG. 7. The first gate line is disposed at a position farther from the first side than the second gate line. Then, the number of locations (one location in FIG. 7) where the connection part 8 (or connection part 8A) is disposed between the first gate line and the corresponding vertical gate line 7 (or vertical gate lines 7A) is equal to or smaller than the number of locations (two locations in FIG. 7) where the connection part 8 (or connection part 8A) is disposed between the second gate line and the corresponding vertical gate line 7 (or vertical gate lines 7A). With such a configuration, since the number of connection parts 8A for connecting to one gate line 1 disposed near the input side increases, the current to be input into the vertical gate line 7A near the input side with a small line load is dispersed. Therefore, the charge/discharge current to be input into the connection part 8A can be reduced, thus preventing a display failure caused by heat generated in the vertical gate line 7A.

Further, according to the preferred embodiment described above, the display apparatus includes the plurality of gate lines 1 (first gate lines), the plurality of vertical gate lines 7, and the plurality of connection parts 8. The gate line 1 is disposed in the display region 50 on the array substrate 11. The vertical gate line 7 is disposed in the display region 50 and orthogonal to the gate line 1. The connection part 8 connects some of the gate lines 1 and the corresponding vertical gate line 7. Here, the plurality of vertical gate lines 7 extend from the first side in the display region 50. In addition, at least the first gate line 1 disposed closest to the first side is not connected the connection part 8 or the vertical gate lines 7.

With such a configuration, the gate line 1 located near the input side is connected to the gate driver IC 5 via the gate taper line 300B without passing through the connection part 8. It is thus possible to prevent a large amount of heat from being generated at the connection part 8 due to a small line load.

Further, according to the preferred embodiment described above, at least the gate line 1 disposed closest to the first side is connected to the gate taper line 300B (second gate line) disposed in the frame region 55 surrounding the display region 50 in plan view on the second side that is a side different from the first side in the display region 50. Here, the second side corresponds, for example, to the right side in the display region 50. With such a configuration, the gate line 1 located near the input side is connected to the gate driver IC 5 via the gate taper line 300B without passing through the connection part 8. It is thus possible to prevent a large amount of heat from being generated at the connection part 8 due to a small line load. Further, since the gate taper line 300B is connected to the gate line 1 on the side different from the input side, the line connected to the gate driver IC 5 becomes long. Therefore, the line load of the line increases, and heat generation in the line can be reduced.

Further, according to the preferred embodiment described above, the display apparatus includes the plurality of gate lines 1, the plurality of vertical gate lines 7, the plurality of connection parts 8, the plurality of gate taper lines 300A, and the plurality of gate taper line 300C, and the conductive film 62. The vertical gate line 7 is disposed in the display region 50 on the array substrate 11. The vertical gate line 7 is disposed in the display region 50. The vertical gate line 7 extends from the first side in the display region 50. Further, the vertical gate line 7 is orthogonal to the gate line 1. The connection part 8 connects one gate line 1 and one corresponding vertical gate line 7. The gate taper line 300A and the gate taper line 300C are disposed in the frame region 55 surrounding the display region 50 in plan view and are connected to the respective vertical gate lines 7 on the first side. Here, the connection part 8 disposed closest to the first side is the first connection part. The first connection part corresponds, for example, to the connection part 8 disposed closest to the input side in FIG. 10, that is, the connection part 8 located at the rightmost end in FIG. 10. Further, the vertical gate line 7 connected to the first connection part is the first vertical gate line. The first vertical gate line corresponds, for example, to the vertical gate line 7 having the shortest line extending from the input side in FIG. 10, that is, the vertical gate line 7 located at the rightmost end in FIG. 10. The conductive film 62 is then disposed in the frame region 55. The conductive film 62 overlaps at least the gate taper line 300C connected to the first vertical gate line in plan view.

With such a configuration, parasitic capacitance is generated between the conductive film 62 and the gate taper line 300C. Hence the parasitic capacitance increases the line load on the gate taper line 300C and further on the vertical gate line 7 connected to the gate taper line 300C. Then, the heat generation in the line can be reduced.

Further, according to the preferred embodiment described above, the display apparatus includes the plurality of gate lines 1, the plurality of vertical gate lines 7, the plurality of connection parts 8, the plurality of gate taper lines 300A, and the plurality of gate taper lines 300D. The gate line 1 is disposed in the display region 50 on the array substrate 11. The vertical gate line 7 is disposed in the display region 50, extends from the first side in the display region 50, and is orthogonal to the gate line 1. The connection part 8 connects one gate line 1 and one corresponding vertical gate line 7. The gate taper line 300A and the gate taper line 300D are disposed in the frame region 55 surrounding the display region 50 in plan view and are connected to the respective vertical gate lines 7 on the first side. Here, the connection part 8 disposed closest to the first side is the first connection part. The first connection part corresponds, for example, to the connection part 8 disposed closest to the input side in FIG. 11, that is, the connection part 8 located at the rightmost end in FIG. 11. Further, the vertical gate line 7 connected to the first connection part is the first vertical gate line. The first vertical gate line corresponds, for example, to the vertical gate line 7 having the shortest line extending from the input side in FIG. 11, that is, the vertical gate line 7 located at the rightmost end in FIG. 11. At least the line width of the gate taper line 300D connected to the first vertical gate line is smaller than the line width of the others of the gate taper lines 300A.

With such a configuration, the line resistance of the gate taper line 300D increases. Hence the line resistance leads to an increase in line load of the vertical gate line 7 connected to the gate taper line 300D. Then, the heat generation in the line can be reduced.

Further, according to the preferred embodiment described above, the display apparatus includes the plurality of gate lines 1, the plurality of vertical gate lines 7, the plurality of connection parts 8, the plurality of gate taper lines 300A, and the plurality of gate taper lines 300D. The gate line 1 is disposed in the display region 50 on the array substrate 11. The vertical gate line 7 is disposed in the display region 50, extends from the first side in the display region 50, and is orthogonal to the gate line 1. The connection part 8 connects one gate line 1 and one corresponding vertical gate line 7. The gate taper line 300A and the gate taper line 300D are disposed in the frame region 55 surrounding the display region 50 in plan view and are connected to the respective vertical gate lines 7 on the first side. Here, the connection part 8 disposed closest to the first side is the first connection part. The first connection part corresponds, for example, to the connection part 8 disposed closest to the input side in FIG. 11, that is, the connection part 8 located at the rightmost end in FIG. 11. Further, the vertical gate line 7 connected to the first connection part is the first vertical gate line. The first vertical gate line corresponds, for example, to the vertical gate line 7 having the shortest line extending from the input side in FIG. 11, that is, the vertical gate line 7 located at the rightmost end in FIG. 11. At least the gate taper line 300D connected to the first vertical gate line has a zigzag shape.

With such a configuration, the line length of the gate taper line 300D becomes larger than that of the gate taper line 300A under the same conditions (e.g., under conditions that the position of the connection part 8 is equal and the connection is made to the gate driver IC 5 in the same manner). Hence the line length of the gate taper line 300D increases, and the increase in line resistance leads to an increase in line load of the vertical gate line 7 connected to the gate taper line 300D. Then, the heat generation in the line can be reduced.

Further, according to the preferred embodiment described above, the display apparatus includes the plurality of gate lines 1, the plurality of vertical gate lines 7, the plurality of connection parts 8, and the plurality of extension parts 64. The gate line 1 is disposed in the display region 50 on the array substrate 11. The vertical gate line 7 is disposed in the display region 50 and orthogonal to the gate line 1. The connection part 8 connects one gate line 1 and one corresponding vertical gate line 7. The extension parts 64 are connected to the respective connection parts 8 and arranged parallel to the vertical gate line 7. The vertical gate line 7 extends from the first side in the display region 50. Further, the extension part 64 extends to the side opposite to the first side in the display region 50.

With such a configuration, since the extension part 64 connected to the vertical gate line 7 via the connection part 8 has the line resistance, the line load of the vertical gate line 7 increases. Then, the heat generation in the line can be reduced.

<Regarding Modifications of Preferred Embodiments Described Above>

Although being described by using the liquid crystal display apparatus for the sake of convenience, the present preferred embodiment is actually a technique widely applicable to the entire display apparatus.

Although the preferred embodiments described above may also describe the material quality, material, dimensions, shape, relative positional relationship, conditions for implementation, or the like, of each component, each of these is one example in all aspects and is not limited to what is described in the present specification.

Accordingly, numerous modifications and equivalents, not shown by examples, are conceived within the scope of the technology disclosed in the present specification. This includes, for example, a case where at least one component is modified, added, or omitted, and further includes a case where at least one component in at least one preferred embodiment is extracted and combined with a component of another preferred embodiment.

Unless there is a contradiction, as for a component described as being provided as "one" component in the preferred embodiments described above, "one or more" components may be provided.

Further, each component in the preferred embodiments described above is a conceptual unit, and within the scope of the technology disclosed in the present specification, there are included a case where one component is made up of a plurality of structures, a case where one component corresponds to a part of a structure, and a case where a plurality of components are provided in one structure.

Moreover, each component in the preferred embodiment described above includes a structure having another structure or shape so long as the same function is exhibited.

The description in the present specification is referred to for all purposes related to the present technology, and none is recognized as prior art.

In addition, in the preferred embodiments described above, when a material name or the like is described without being specified, unless there is contradiction, the material contains other additives, for example, an alloy or the like.

While the invention has been shown and described in detail, the foregoing description is in all aspects illustrative and not restrictive. It is therefore understood that numerous modifications and variations can be devised without departing from the scope of the invention.

What is claimed is:

1. A display apparatus comprising:
  a plurality of first gate lines arranged in a display region on an array substrate;
  a plurality of vertical gate lines arranged in the display region, extending from a first side in the display region, and orthogonal to the first gate lines;
  a plurality of connection parts, each of which connects one of the first gate lines and corresponding one of the vertical gate lines; and
  a plurality of second gate lines arranged in a frame region surrounding the display region in plan view and connected to the respective vertical gate lines on the first side,
  wherein
  the connection part disposed closest to the first side is a first connection part,
  the vertical gate line connected to the first connection part is a first vertical gate line, and
  a resistance or a capacitance added to the first vertical gate line is larger than the resistance or the capacitance added to other vertical gate lines that are connected to the connection parts that are further away from the first side.

2. The display apparatus according to claim 1, wherein the capacitance added to the first vertical gate line is the capacitance formed between the second gate line connected to the first vertical gate line and a conductive film overlapping with the second gate line in plan view.

3. The display apparatus according to claim 1, wherein the resistance added to the first vertical gate line is a resistance increase caused by the second gate line that is connected to the first vertical gate line having smaller line width than other second gate lines.

4. The display apparatus according to claim 1, wherein the resistance added to the first vertical gate line is the resistance increase caused by the second gate line that is connected to the first vertical gate line being wired in a zigzag shape.

5. The display apparatus according to claim 1, further comprising:
  a plurality of extension parts connected to the respective connection parts and arranged parallel to the vertical gate lines,
  wherein
  the plurality of vertical gate lines extend from the first side in the display region, and
  the plurality of extension parts extend to a side opposite to the first side in the display region.

6. The display apparatus according to claim 1, wherein
  the connection part disposed second closest to the first side is a second connection part,
  the vertical gate line connected to the second connection part is a second vertical gate line, and
  the resistance or the capacitance added to the first vertical gate line and the resistance or capacitance added to the second vertical gate line are larger than the resistance or the capacitance added to any of the other vertical gate lines that are connected to the connection parts that are further away from the first side than the first and second vertical gate lines.

* * * * *